US009318973B2

(12) United States Patent
Yamanaka

(10) Patent No.: US 9,318,973 B2
(45) Date of Patent: Apr. 19, 2016

(54) DRIVING DEVICE

(71) Applicant: DENSO CORPORATION, Kariya, Aichi-pref. (JP)

(72) Inventor: Akitomo Yamanaka, Handa (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/385,526

(22) PCT Filed: Apr. 10, 2013

(86) PCT No.: PCT/JP2013/002436

§ 371 (c)(1),
(2) Date: Sep. 16, 2014

(87) PCT Pub. No.: WO2013/161201

PCT Pub. Date: Oct. 31, 2013

(65) Prior Publication Data

US 2015/0049531 A1 Feb. 19, 2015

(30) Foreign Application Priority Data

Apr. 23, 2012 (JP) .................................. 2012-98152

(51) Int. Cl.
*H03B 1/00* (2006.01)
*H03K 3/00* (2006.01)
(Continued)

(52) U.S. Cl.
CPC ........... *H02M 7/537* (2013.01); *H03K 17/0828* (2013.01); *H03K 17/168* (2013.01); *H02M 1/08* (2013.01); *H02M 1/44* (2013.01); *H02M 7/5387* (2013.01); *H02M 2001/0029* (2013.01)

(58) Field of Classification Search
CPC ........... H05B 33/0815; H05B 33/0827; H05B 33/0818; H01L 27/0629; H01L 28/20; H03K 2217/0081; H03K 17/063; H03K 17/163; H03K 17/0412; H03K 17/0822
USPC .................................. 327/108–112; 363/131
See application file for complete search history.

(56) References Cited

U.S. PATENT DOCUMENTS

| 6,771,097 | B1* | 8/2004 | Poh Ho et al. ................ 327/108 |
| 6,943,588 | B1* | 9/2005 | Luo et al. ......................... 326/86 |
| 7,075,355 | B2* | 7/2006 | Furuie et al. .................. 327/434 |
| 8,319,529 | B2* | 11/2012 | Ikeda ............................ 327/109 |

FOREIGN PATENT DOCUMENTS

| JP | 05-83100 A | 4/1993 |
| JP | 2000-114955 A | 4/2000 |
| JP | 2000-232347 A | 8/2000 |
| JP | 2004-266368 A | 9/2004 |

(Continued)

OTHER PUBLICATIONS

International Search Report and Written Opinion of the International Searching Authority mailed Jun. 4, 2013 for the corresponding international application No. PCT/JP2013/002436 (and English translation).

*Primary Examiner* — Diana J Cheng
(74) *Attorney, Agent, or Firm* — Posz Law Group, PLC

(57) ABSTRACT

A driving device includes a driving circuit and a control circuit. The driving circuit has an input terminal and an output terminal and applies a driving voltage to a switching element through the output terminal. The control circuit outputs two types of control signals to the input terminal of the driving circuit. The driving circuit has a circuit group including multiple unit circuits which are turned ON by the same control signal. Each unit circuit includes one voltage source, one switch controlled to be turned ON and OFF by the control signals, and one resistor connected in series to the switch between the voltage source and the output terminal. Each voltage source outputs a different voltage, and each resistor has a different resistance. One end of each switch of all the unit circuits is connected to the output terminal.

14 Claims, 11 Drawing Sheets

(51) Int. Cl.
*H02M 7/537* (2006.01)
*H03K 17/082* (2006.01)
*H03K 17/16* (2006.01)
*H02M 1/08* (2006.01)
*H02M 1/44* (2007.01)
*H02M 7/5387* (2007.01)
*H02M 1/00* (2007.01)

(56) References Cited

FOREIGN PATENT DOCUMENTS

| | | |
|---|---|---|
| JP | 2009-273071 A | 11/2009 |
| JP | 2011-010441 A | 1/2011 |
| JP | 2011-018958 A | 1/2011 |
| JP | 2011-135731 A | 7/2011 |

\* cited by examiner

DRIVING DEVICE

CROSS REFERENCE TO RELATED APPLICATION

The present disclosure is a U.S. national stage application of PCT/JP2013/002436 filed on Apr. 10, 2013 and is based on Japanese Patent Application No. 2012-98152 filed on Apr. 23, 2012, the disclosures of which are incorporated herein by reference.

TECHNICAL FIELD

The present disclosure relates to a driving device for applying a driving voltage to a switching element.

BACKGROUND ART

A voltage-driven switching element such as an insulated gate bipolar transistor (IGBT) has been used to drive a motor of a vehicle, for example. The switching element is connected to a driving circuit which has a voltage source to apply a drive voltage to the switching element. Further, a control circuit is connected through the driving circuit to the switching element so that a timing of turn-on or turn-off of the switching element can be controlled.

By the way, noise such as overshooting, undershooting, or ringing occurs in the driving voltage to be applied at the switching between ON and OFF of the switching element. When an internal resistance of the drive circuit is increased to reduce the noise, a switching speed at the switching between ON and OFF of the switching element is reduced. As a result, switching loss occurs.

The patent document 1 has proposed a driving device including a driving circuit with a function of changing a rate of change in a driving voltage in order to resolve the trade-off between the noise and the switching loss. This driving element detects the driving voltage and the change rate using multiple detection circuits and feedbacks them to a control circuit. Then, the control circuit outputs a control signal to the driving circuit, thereby changing the driving voltage and its change rate.

PRIOR ART DOCUMENT

Patent Document

Patent Document 1: JP-A-2009-273071

SUMMARY OF THE INVENTION

As described above, the driving device proposed in the patent document 1 needs a mechanism for feeding back the driving voltage and the change rate to the control circuit through the detection circuits, so the circuit structure may be complicated. Further, when the driving voltage to be applied to the switching element is changed in a very short time of, for example, the order of 10 ns (when the switching element is driven at high speed so that the switching loss can be reduced), it is difficult to change the driving voltage at an appropriate timing due to a delay in a feedback signal. Further, the control circuit receives the feedback signals from multiple detection circuits and outputs the control signals to multiple switching elements of the driving circuit, separately. In other words, the control circuit needs to control multiple input signals and multiple output signals in a very short time.

In view of the above, it is an object of the present disclosure to provide a driving device including a driving circuit for outputting a driving voltage and a control circuit for controlling the driving circuit by a simpler control signal so that the driving voltage can be changed at a more appropriate timing.

According to a first aspect of the present disclosure, a driving device for applying a driving voltage to a switching element includes a driving circuit and a control circuit. The driving circuit has an input terminal and an output terminal and applies the driving voltage to the switching element through the output terminal. The control circuit outputs two types of control signals including a Hi signal and a Lo signal to the input terminal of the driving circuit to control the driving circuit.

The driving circuit includes multiple unit circuits. Each unit circuit includes one voltage source, one switch controlled to be turned ON and OFF by the control signals, and one resistor connected in series to the switch between the voltage source and the output terminal. Some of the unit circuits are turned ON by the same control signal and form a circuit group.

In the circuit group, the voltage source of each unit circuit outputs a different voltage, and the resistor of each unit circuit has a different resistance.

In the driving circuit, the switch of each unit circuit is electrically connected to the same input terminal, and one end of the resistor of each unit circuit is electrically connected to the same output terminal.

Thus, the driving circuit is connected to the control circuit through one input terminal only. That is, the control circuit can change the driving voltage applied to the driving device and its change rate at a predetermined timing by turning ON and OFF the switches of the driving circuit by simply outputting two types of control signals including a Hi signal and a Lo signal to the input terminal.

Specifically, out of the unit circuits whose switch are ON, the unit circuit where a current flows from the voltage source toward the output terminal is determined by the driving voltage applied to the driving device. Therefore, a combined resistance between the input terminal and the output terminal depends on the driving voltage. A rate of change in the driving voltage depends on a time constant which depends on a combined resistance of the driving circuit and a parasitic capacitance of the switching element. Accordingly, a time necessary for the driving voltage to change can be determined by determining a voltage before and after the driving voltage changes. That is, in the circuit group which is turned ON by the same control signal, a designer can arbitrarily determine a timing at which the driving voltage changes by setting predetermined values for the voltage of the voltage source and the resistance of the resistor of each unit circuit According to this structure, unlike the patent document 1, the control circuit does not need multiple input terminals to receive signals from detection circuits. Further, the control circuit does not need multiple output terminals. Accordingly, a logic structure of the control circuit can be simplified. Further, as described above, the timing at which the driving voltage changes depends on the voltage source and the resistor in the driving circuit. For this reason, a mechanism to feed back the driving voltage to the control circuit through the detection circuit can be omitted. In other words, a time necessary to feedback and a time necessary for the control circuit to output the control signal to the driving circuit can be omitted. Thus, it is possible to change the driving voltage at an appropriate timing by a simpler control signal without a delay in control of the driving circuit.

BRIEF DESCRIPTION OF THE DRAWINGS

The above and other objects, features and advantages of the present disclosure will become more apparent from the following detailed description made with reference to the accompanying drawings. In the drawings.

EMBODIMENTS OF THE INVENTION

Figure 1:
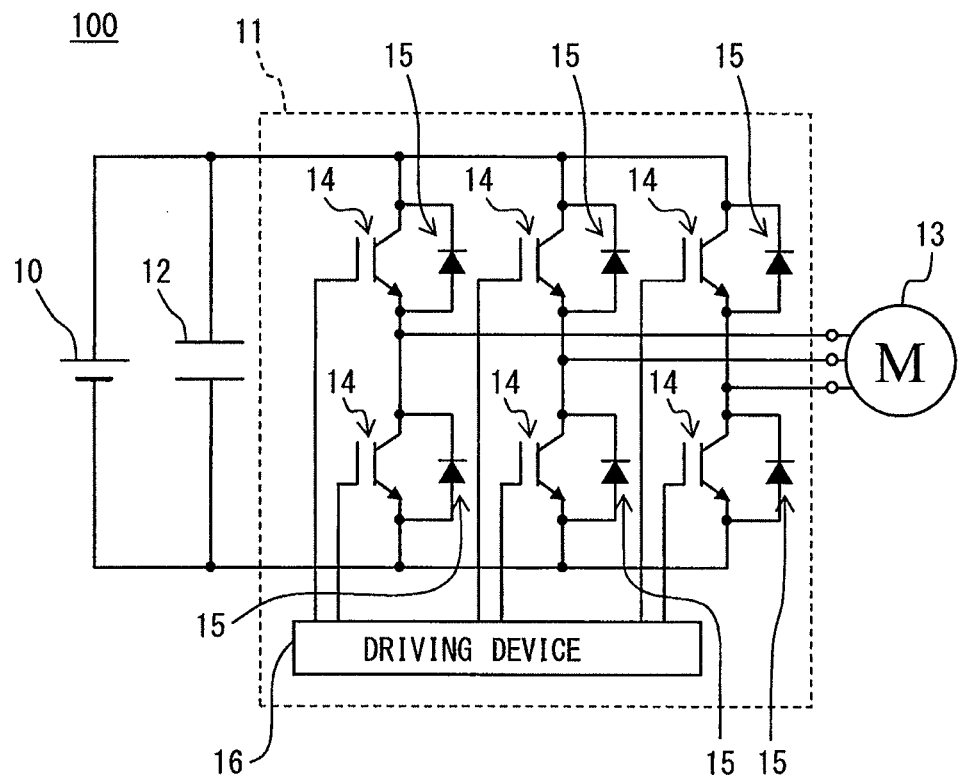
FIG. 1 is a diagram illustrating a structure of an inverter circuit provided with a driving device according to a first embodiment.

Embodiments of the present disclosure are described below with reference to the drawings. In the drawings, like characters of reference indicate the same or equivalent parts.

First Embodiment

Firstly, an overview of a structure of a driving device according to the present embodiment is described with reference to FIG. 1 and FIG. 2.

As shown in FIG. 1, according to the present embodiment, the driving device is used in, for example, an inverter circuit 100 which converts a DC voltage to a voltage (an AC voltage) with a predetermined frequency. The inverter circuit 100 includes a DC voltage source 10, an inverter portion 11 for converting a DC voltage to an AC voltage, and a capacitor 12. The capacitor 12 is connected in parallel to the inverter portion 11 and reduces fluctuations in a DC voltage generated by a switching action of a switching element of the inverter portion 11. An AC voltage produced by the inverter portion 11 is applied to a motor 13.

According to the present embodiment, for example, the switching element of the inverter portion 11 can be an insulated gate bipolar transistor 14 (hereinafter referred to as the IGBT). A freewheeling diode 15 is connected in parallel to the IGBT 14. Two IGBTs 14 are connected in series, and a connection point (middle point) between them is electrically connected to the motor 13. According to the present embodiment, three series circuits, each of which has a pair of IGBTs 14 connected in series, are connected in parallel, and their respective middle points are connected to the motor 13. The gate electrodes of the six IGBTs 14 are connected to a driving device 16. The driving device 16, which is a major feature of the present disclosure, applies a driving voltage to each IGBT 14 at a predetermined timing, thereby controlling ON and OFF of the IGBT 14.

Figure 2:
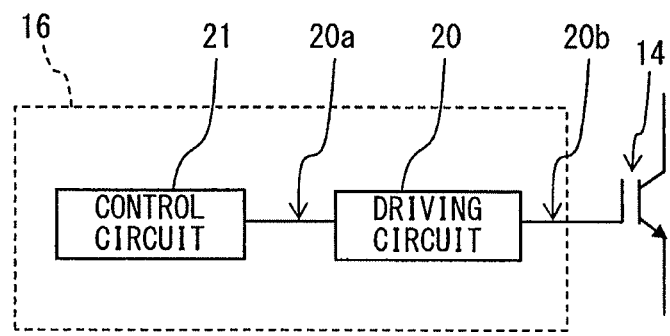
FIG. 2 is a diagram illustrating a circuit structure of the driving device.

According to the present embodiment, as shown in FIG. 2, the driving device 16 includes a driving circuit 20 for supplying the driving voltage to the IGBT 14 and a control circuit 21 for controlling ON and OFF of the driving circuit 20. The driving circuit 20 has one input terminal 20a and one output terminal 20b. A concrete structure of the driving circuit 20, which is a major feature of the present disclosure, is described in detail later. Further, the control circuit 21 supplies a Hi signal and a Lo signal, which are used to control ON and OFF of a switch described later, to the input terminal 20a of the driving circuit 20.

Next, the concrete structure of the driving circuit 20 is described below with reference to FIG. 3.

Figure 3:
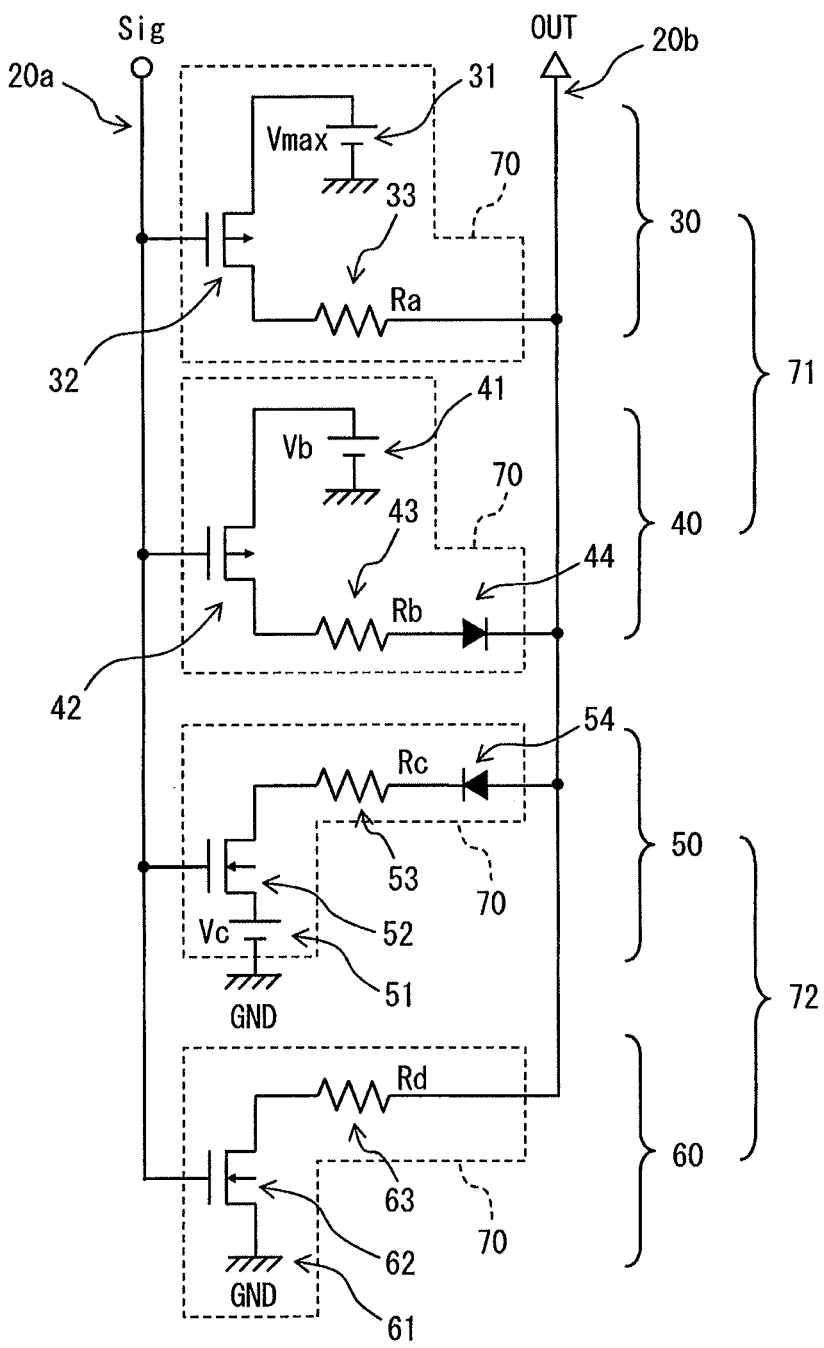
FIG. 3 is a diagram illustrating a concrete structure of a driving circuit.

As shown in FIG. 3, the driving circuit 20 includes a maximum voltage circuit 30, a turn-on circuit 40, a turn-off circuit 50, and a reference voltage circuit 60. Each circuit includes one unit circuit 70 where voltages sources 31, 41, 51, and 61, switches 32, 42, 52, and 62, and resistors 33, 43, 53, and 63 are respectively connected in series. According to the present embodiment, the switches 32, 42, 52, and 62 are MOS transistors, and when a control signal (denoted as Sig in FIG. 3) is supplied to their gate electrode, the voltage sources 31, 41, 51, and 61 are electrically connected to the output terminal (denoted as OUT in FIG. 3). Alternatively, the switches 32, 42, 52, and 62 can be elements having three or more terminals such as bipolar transistors, as long as they can electrically connect the voltage sources 31, 41, 51, and 61 to the output terminal according to the control signal.

The respective structures of the circuits 30, 40, 50, and 60 are described below.

In the maximum voltage circuit 30, the voltage source 31 has a maximum voltage (denoted as Vmax in FIG. 3) higher than those of the other voltage sources 41, 51, and 61. The switch 32 is a PMOS transistor and turned ON when receiving the Lo signal as the Sig. The resistor 33 has a resistance (denoted as Ra) higher than, at least, that of the resistor 43 of the turn-on circuit 40. According to the present embodiment, for example, the Ra is higher than a resistance of the resistor 53 of the turn-off circuit 50.

In the turn-on circuit 40, the voltage source 41 has a voltage (denoted as Vb in FIG. 3) lower than that of the voltage source 31 of the maximum voltage circuit 30. Like in the maximum voltage circuit 30, the switch 42 is a PMOS transistor. The resistor 43 has a resistance (denoted as Rb in FIG. 3) lower than the resistance Ra of the resistor 33 of the maximum voltage circuit 30. Further, the turn-on circuit 40 includes a diode 44 which prevents a backflow current from the output terminal 20b to the voltage source 41.

In the turn-off circuit 50, the voltage source 51 has a voltage (denoted as Vc in FIG. 3) lower than that of the voltage source 31 of the maximum voltage circuit 30. The switch 42 is a NMOS transistor and turned ON when receiving the Hi signal as the Sig. The resistor 53 has a resistance (denoted as Rc in FIG. 3) lower than a resistance Rd of the resistor 63 of the reference voltage circuit 60 which is described later. Further, the turn-off circuit 50 includes a diode 54 which prevent a backflow current from the voltage source 51 to the output terminal 20b.

In the reference voltage circuit 60, the voltage source 61 has a reference voltage lower than those of the other voltage sources 31, 41, and 51. According to the present embodiment, the voltage source 61 has a ground potential (denoted as GND in FIG. 3). Like in the turn-off circuit 50, the switch 62 is a NMOS transistor. The resistor 63 has a resistance (denoted as Rd in FIG. 3) higher than the resistance Rc of the resistor 53 of the turn-off circuit 50.

According to the first embodiment, the maximum voltage circuit 30 and the turn-on circuit 40, which are turned ON by the same control signal (Lo signal), form one circuit group 71 recited in claims. That is, the circuit group 71 is in ON state during a turn-on period where the driving voltage increases. In contrast, the turn-off circuit 50 and the reference voltage circuit 60, which are turned ON by the same control signal (Hi signal), form another circuit group 72. The circuit group 72 is in ON state during a turn-off period where the driving voltage decreases.

As described above, the voltages Vmax, Vb, Vc, and GND of the voltage sources 31, 41, 51, and 61 of the driving circuit 20 have the following magnitude relationship: Vmax>(Vb, Vc)>GND. Further, the resistances Ra, Rb, Rc, and Rd of the resistors 33, 43, 53, and 63 have the following magnitude relationship: Ra>Rb, Rd>Rc. It is noted that the magnitude relationships between Vb and Vc, between Rb and Rc, and between Ra and Rd can be set arbitrarily without being limited.

Figure 4:
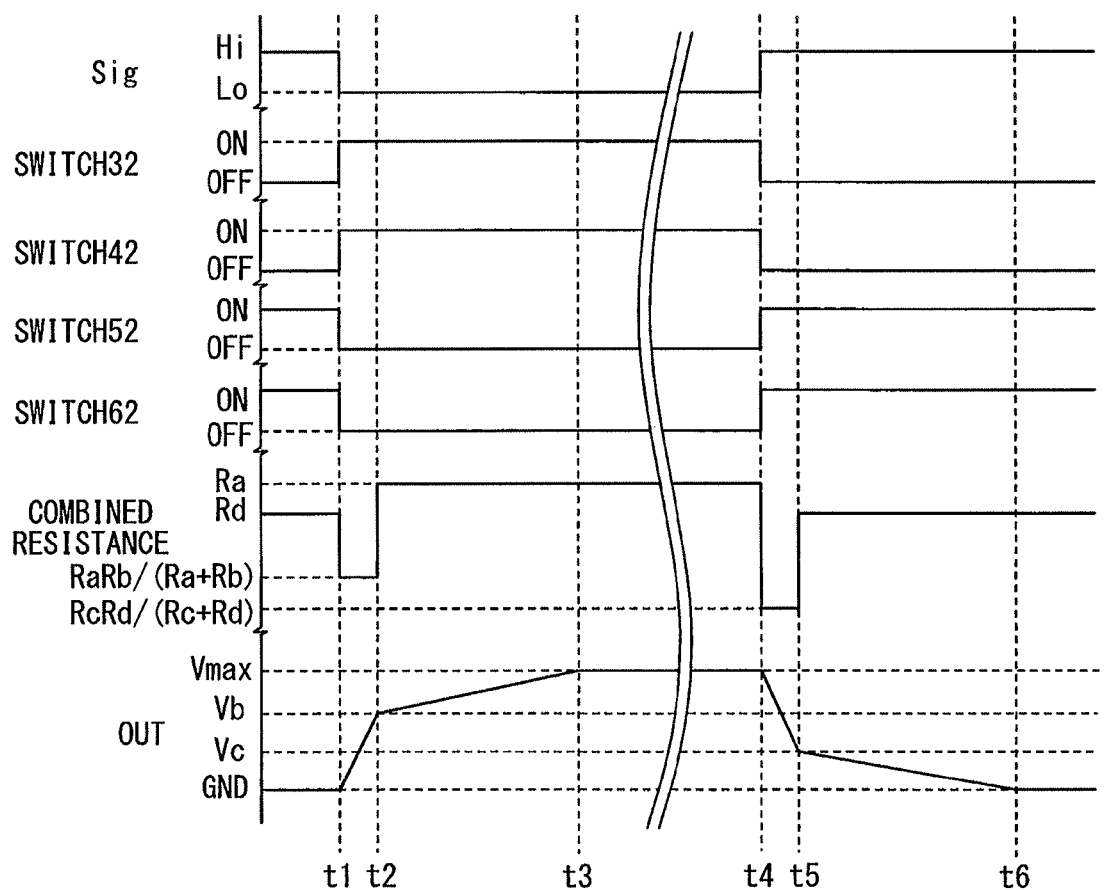
FIG. 4 is a timing diagram illustrating a control signal from a control circuit, ON and OFF states of each switch of the driving circuit, a combined resistance of the driving circuit, and a voltage of an output terminal.

Next, operations and effects of the driving circuit 20 according to the present embodiment are described with reverence to FIG. 4. As described above, the magnitude relationships between Vb and Vc, between Rb and Rc, and between Ra and Rd are not limited. However, according to the present embodiment, the magnitude relationships are set as follows: Vb>Vc, Rb>Rc, and Ra>Rd.

FIG. 4 shows an example of a timing diagram when the driving voltage is applied to the output terminal 20b and by extension to the IGBT 14. In this example, there is a turn-on period (t1 to t3) where the driving voltage outputted to the output terminal 20b changes from the ground potential GND to the maximum voltage Vmax and a turn-off period (t4 to t6) where the driving voltage outputted to the output terminal 20b changes from the Vmax to the GND. The turn-on starts at a time t1 and ends at a time t3 by way of a time t2. Then, the maximum voltage Vmax is outputted to the output terminal 20b during a period from the time t3 to a time t4. Then, the turn-off starts at the time t4 and ends at a time t6 by way of a time t5. The time-series behavior of the driving is described in detail below.

Before the turn-on starts (before t1), i.e., in an initial power-on state or in an initial state from when the time t6 passes to when the time t1 comes, the Hi signal as the control signal Sig is inputted to the input terminal 20a. Accordingly, the switches 32, 42 are in OFF state so that the voltage sources 31, 41 can be electrically isolated from the output terminal 20b. In contrast, the switches 52, 62 are in ON state so that the voltage sources 51, 61 can be electrically connected to the output terminal 20b. Thus, the circuit group 71 is in OFF state, and the circuit group 72 is in ON state. However, in the initial state, since the output terminal 20b is at the GND, the diode 54 of the turn-off circuit 50 prevents a current from flowing from the voltage source 51 whose voltage is higher than the GND to the output terminal 20b. Therefore, the output terminal 20b is at the GND, and a combined resistance of the driving circuit 20 is equal to the Rd.

The Sig changes from the Hi signal to the Lo signal at the time t1. Accordingly, the switches 32, 42 are turned ON so that the voltage sources 31, 41 can be electrically connected to the output terminal 20b. In contrast, the switches 52, 62 are turned OFF so that the voltage sources 51, 61 can be electrically isolated from the output terminal 20b. Thus, the circuit group 71 is tuned ON, and the circuit group 72 is turned OFF. Since the Vmax and the Vd are higher in voltage than the GND, the driving voltage outputted to the output terminal 20b starts to increase from the GND.

After the time t1, the driving voltage increases at a predetermined rate of change. This change rate depends on an internal resistance of the driving circuit 20, and a change in the driving voltage with respect to an elapsed time decreases with an increase in the resistance. During a period from the time t1 to the time t2 when the driving voltage reaches the Vb, a current flows from each of the voltage sources 31, 41 of the maximum voltage circuit 30 and the turn-on circuit 40 toward the output terminal 20b. That is, the combined resistance of the driving circuit 20 is given as follows: Ra·Rb/(Ra+Rb). Therefore, during the period from the time t1 to the time t2, the driving voltage changes from the GND to the Vb at the change rate depending on the combined resistance.

At the time t2, the driving voltage reaches the Vb. Accordingly, in the turn-on circuit 40, no current flows between the power source 41 and the output terminal 20b.

After the time t2, the driving voltage increases from the Vb to the Vmax. It is noted that the voltage of the output terminal 20b is higher than the Vb during a period from the time t2 to the time t3 when the driving voltage reaches the Vmax. However, the diode 44 of the turn-on circuit 40 prevents the backflow current from the output terminal 20b to the voltage source 41. That is, in the turn-on circuit 40, no current flows between the voltage source 41 and the output terminal 20b, and the combined resistance of the driving circuit 20 becomes equal to the Ra. According to the present embodiment, since Ra>Rb, the combined resistance Ra in the period from the time t2 to the time t3 is greater than the combined resistance Ra·Rb/(Ra+Rb) in the period from the time t1 to the time t2. That is, Ra>Ra·Rb/(Ra+Rb). Accordingly, the change rate of the driving voltage is smaller in the period from the time t2 to the time t3 than in the period from the time t1 to the time t2. In other words, the combined resistance of the driving circuit 20 changes automatically at the time t2 so that the change rate of the driving voltage can change automatically. The time t2 depends on the resistances Ra, Rb of the resistors 33, 43 and the voltages Vmax, Vb of the voltage sources 31, 41. A designer can set arbitrary values for these resistances and voltages. According to the present embodiment, there is no need to use a control signal to change the driving voltage. That is, the change rate of the driving voltage can be changed by a simpler control signal after a predetermined time (the time t2 in the present embodiment).

The voltage Vmax is applied to the gate electrode of the IGBT 14 during the period from the time t3 when the turn-on ends, to the time t4 when the turn-off starts. For example, when the Vmax is set to about 15V, the IGBT can be turned ON without an increase in a saturation voltage (ON-resistance).

The Sig changes from the Lo signal to the Hi signal at the time t4. Accordingly, the switches 32, 42 are turned OFF so that the voltage sources 31, 41 can be electrically isolated from the output terminal 20b. In contrast, the switches 52, 62 are turned ON so that the voltage sources 51, 61 can be electrically connected to the output terminal 20b. Thus, the circuit group 71 is tuned OFF, and the circuit group 72 is turned ON. Since the GND and the Vc are lower in voltage than the Vmax, the driving voltage outputted to the output terminal 20b starts to decrease from the Vmax.

During the period from the time t4 to the time t5 when the driving voltage reaches the Vc, a current flows from the output terminal 20b toward each of the voltage sources 51, 61 of the turn-off circuit 50 and the reference voltage circuit 60. That is, the combined resistance of the driving circuit 20 is given as follows: Rc·Rd/(Rc+Rd). Therefore, during the period form the time t4 to the time t5, the driving voltage changes from the Vmax to the Vc at the change rate depending on this combined resistance.

At the time t5, the driving voltage reaches the Vc. Accordingly, in the turn-off circuit 50, no current flows between the voltage source 51 and the output terminal 20b.

After the time t5, the driving voltage decreases from the Vc to the GND. It is noted that the voltage of the output terminal 20b is lower than the Vc during the period from the time t5 to the time t6 when the driving voltage reaches the GND. However, the diode 54 of the turn-off circuit 50 prevents the backflow current from the voltage source 51 to the output terminal 20b. That is, in the turn-off circuit 50, no current flows between the voltage source 51 and the output terminal 20b, and the combined resistance of the driving circuit 20 becomes equal to the Rd. According to the present embodiment, since Rd>Rc, the combined resistance Rd in the period from the time t5 to the time t6 is greater than the combined resistance Rc·Rd/(Rc+Rd) in the period from the time t4 to the time t5. That is, Rd>Rc·Rd/(Rc+Rd). Accordingly, the change rate of the driving voltage is smaller in the period from the time t5 to the time t6 than in the period from the time t4 to the time t5. In other words, the combined resistance of the driving circuit 20 changes automatically at the time t5 so that the change rate of the driving voltage can change automatically. The time t5 depends on the resistances Rc, Rd of the resistors 53, 63 and the voltages Vc, GND of the voltage sources 51, 61. A designer can set arbitrary values for these resistances and voltages. According to the present embodiment, there is no need to use a control signal to change the driving voltage. That is, the change rate of the driving voltage can be changed by a simpler control signal after a predetermined time (the time t5 in the present embodiment).

According to the present embodiment, the Vb and the Vc are set not less than a threshold of the IGBT 14. For example, the Vb and the Vc can be in a range from about 5V to 10V.

Second Embodiment

Figure 5:
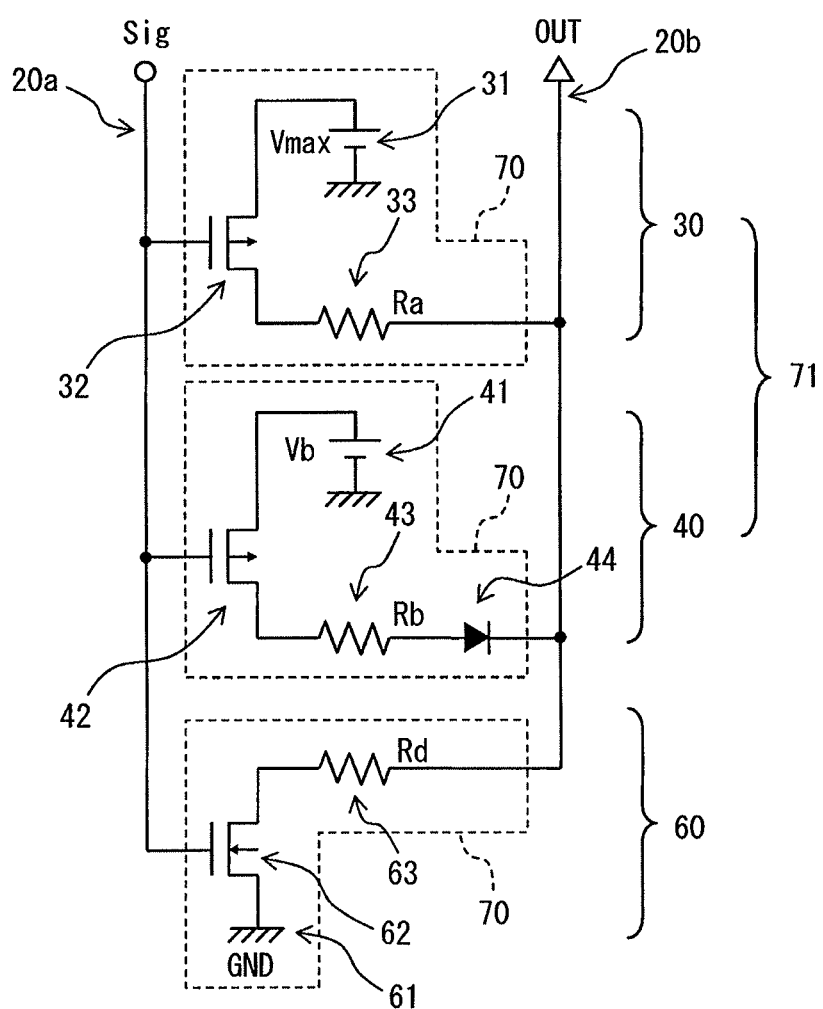
FIG. 5 is a diagram illustrating a concrete structure of a driving circuit of a driving device according to a second embodiment.

In the example described in the first embodiment, the driving circuit 20 includes both the turn-on circuit 40 and the turn-off circuit 50. However, it is possible to employ a structure where either the turn-on circuit 40 or the turn-off circuit 50 is included. According to the present embodiment, for example, as shown in FIG. 5, the driving circuit 20 includes the maximum voltage circuit 30, the turn-on circuit 40, and the reference voltage circuit 60.

Since the driving circuit 20 of the present embodiment differs from that of the first embodiment in that the turn-off circuit 50 is removed, detailed descriptions are omitted. In the driving circuit 20 according to the present embodiment, the voltages Vmax, Vb, and GND of the voltage sources 31, 41, and 61 have the following magnitude relationship: Vmax>Vb>GND. Further, the resistances Ra, Rb of the resistors 33, 43 have the following magnitude relationship: Ra>Rb. It is noted that the magnitude relationships between Ra and Rd and between Rb and Rd can be set arbitrarily without being limited.

Figure 6:
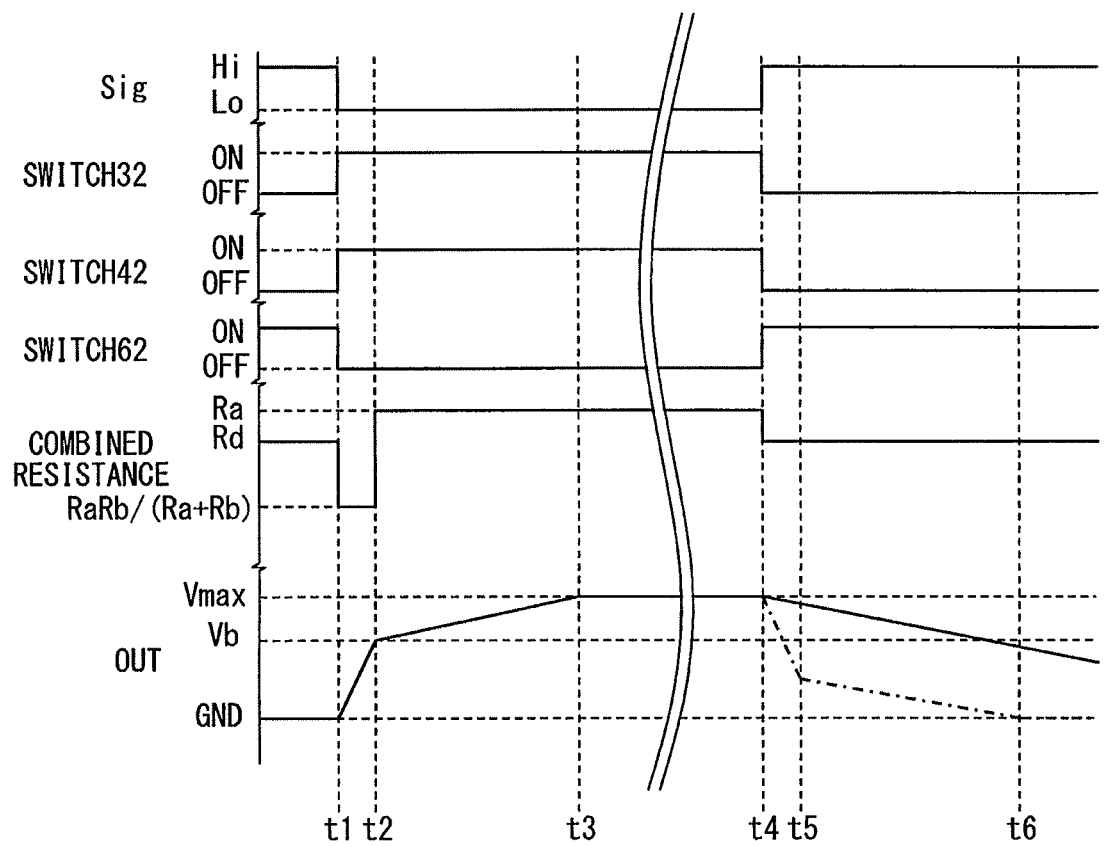
FIG. 6 is a timing diagram illustrating a control signal from a control circuit, ON and OFF states of each switch of the driving circuit, a combined resistance of the driving circuit, and a voltage of an output terminal.

Next, operations and effects of the driving circuit 20 according to the present embodiment are described with reverence to FIG. 6. FIG. 6 shows an example of a timing diagram when the driving voltage is applied to the output terminal 20b and by extension to the IGBT 14. Like in the first embodiment, there is a turn-on period (t1 to t3) where the driving voltage outputted to the output terminal 20b changes from the ground potential GND to the maximum voltage Vmax and a turn-off period (after t4) where the driving voltage outputted to the output terminal 20b changes from the Vmax to the GND.

Since a turn-on operation during the turn-on period is the same as that in the first embodiment, its explanation is omitted. A turn-off operation starts at a time t4 after the drive voltage reaches the Vmax through the turn-on period. That is, the Sig changes from the Lo signal to the Hi signal at the time t4. Accordingly, the switches 32, 42 are turned OFF so that the voltage sources 31, 41 can be electrically isolated from the output terminal 20b. Thus, the circuit group 71 is turned OFF. In contrast, the switch 62 of the reference voltage circuit 60 is turned ON so that the voltage source 61 (GND) can be electrically connected to the output terminal 20b. Since the GND is lower in voltage than the Vmax, the driving voltage outputted to the output terminal 20b starts to decrease from the Vmax. After the time t4, the combined resistance of the driving circuit 20 becomes equal to the Rd, because the voltage sources 31, 41 are electrically isolated from the output terminal 20b. Therefore, the driving voltage decreases at the change rate depending on the resistance Rd. In other words, the driving voltage decreases at the same change rate as the driving voltage changes after reaching the voltage Vc (after the time t5) in the first embodiment. It is noted that FIG. 6 shows not only the change in the driving voltage during the turn-off period according to the present embodiment, but also the change in the driving voltage according to the first embodiment by a dashed-dotted line.

The driving circuit 20 according to the present embodiment can be used effectively for a driving device which is required to change the change rate of the driving voltage at a desired timing during the turn-on period. In other words, it can be employed in a driving device which is not required to focus attention on the change rate of the driving voltage during the turn-off period. Thus, the structure of the driving circuit 20 can be made simpler than that in the first embodiment while the same effects as described in the first embodiment for the turn-on operation can be obtained.

Third Embodiment

The second embodiment differs from the first embodiment in that the driving circuit 20 does not have the turn-off circuit 50. In contrast, the third embodiment differs from the first embodiment in that the driving circuit 20 does not have the turn-on circuit 40.

Figure 7:
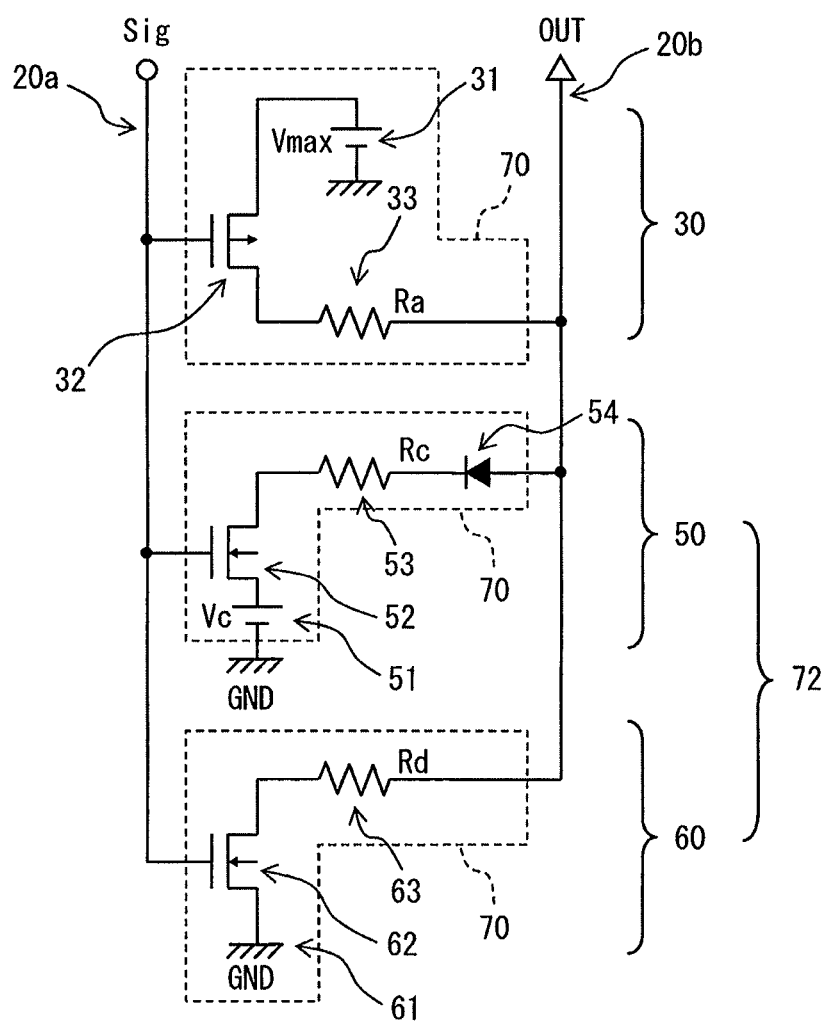
FIG. 7 is a diagram illustrating a concrete structure of a driving circuit of a driving device according to a third embodiment.

As shown in FIG. 7, since the driving circuit 20 of the present embodiment differs from that of the first embodiment in that the turn-on circuit 40 is removed, detailed descriptions are omitted. In the driving circuit 20 according to the present embodiment, the voltages Vmax, Vc, and GND of the voltage sources 31, 51, and 61 have the following magnitude relationship: Vmax>Vc>GND. Further, the resistances Rc, Rd of the resistors 33, 53, 63 have the following magnitude relationship: Rd>Rc. It is noted that the magnitude relationships between Ra and Rc and between Ra and Rd can be set arbitrarily without being limited.

Operations and effects of the driving circuit 20 according to the present embodiment are described. Although a timing diagram is not shown, like in the preceding embodiments, there is a turn-on period where the driving voltage outputted to the output terminal 20b changes from the ground potential GND to the maximum voltage Vmax and a turn-off period, following the turn-on period, where the driving voltage outputted to the output terminal 20b changes from the Vmax to the GND. Since an operation during the turn-on period is the same as that in the preceding embodiments, its explanation is omitted.

At a time when the turn-on period starts, the Sig changes from the Hi signal to the Lo signal. Accordingly, the switch 32 is turned ON so that the voltage source 31 can be electrically connected to the output terminal 20b. In contrast, the switches 52, 62 are turned OFF so that the voltage sources 51, 61 can be electrically isolated from the output terminal 20b. That is, the circuit group 72 is turned OFF. Since the Vmax is higher in voltage than the GND, the driving voltage outputted to the output terminal 20b starts to increase from the GND. The combined resistance of the driving circuit 20 becomes equal to the Ra, because the voltage sources 51, 61 are electrically isolated from the output terminal 20b. Therefore, the driving voltage increases at the change rate depending on the resistance Ra. In other words, the driving voltage increases at the same change rate as the driving voltage changes after reaching the voltage Vb (after the time t2) in the first embodiment.

The driving circuit 20 according to the present embodiment can be used effectively for a driving device which is required to change the change rate of the driving voltage at a desired timing during the turn-off period. In other words, it can be employed in a driving device which is not required to focus attention on the change rate of the driving voltage during the turn-on period. Thus, the structure of the driving circuit 20 can be made simpler than that in the first embodiment while the same effects as described in the first embodiment for the turn-off operation can be obtained.

Fourth Embodiment

The preceding embodiments are based on assumption that an influence of a mirror capacitance, which is a parasitic capacitance of the switching element to be connected to the output terminal 20b, on the driving voltage can be neglected. According to the present embodiment, the influence of the mirror capacitance is taken in consideration in a high-frequency driving device which needs a switching speed. That is, in the driving device, a transition between a reference voltage (e.g., ground potential GND) and a maximum voltage (Vmax) is made in a very short time of, for example, the order of 10 ns.

Figure 8:
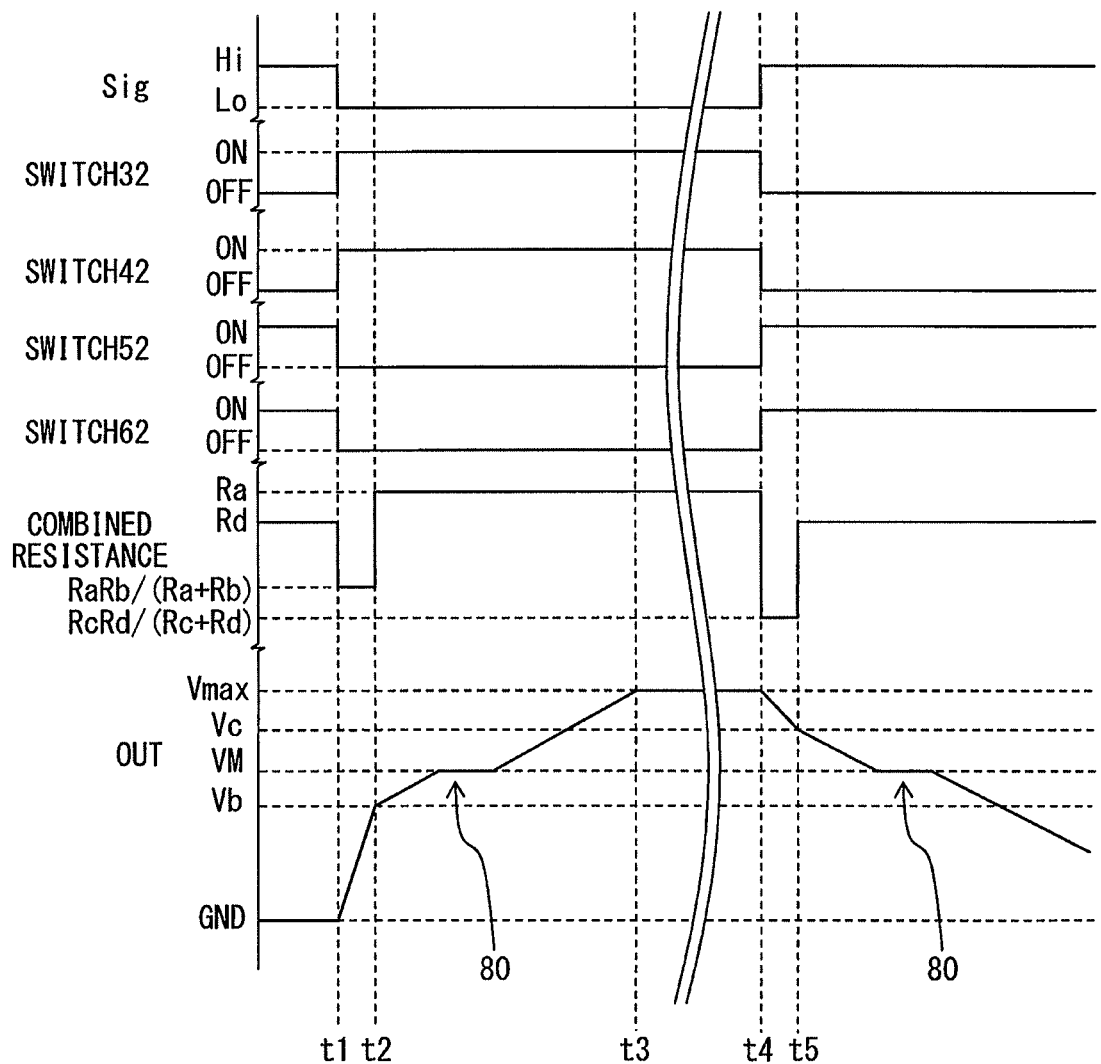
FIG. 8 is a timing diagram illustrating a control signal from a control circuit, ON and OFF states of each switch of the driving circuit, a combined resistance of the driving circuit, and a voltage of an output terminal according to a fourth embodiment.

In such a driving device, as shown in FIG. 8, each of the turn-on period and the turn-off period has a mirror period 80 where the driving voltage outputted to the output terminal 20b is constant at a voltage (denoted as VM in FIG. 8) between the GND and the Vmax. In a period of the turn-on period, where the driving voltage is applied to the gate electrode of the IGBT 14, so that charges are stored in a gate-collector capacitance, a potential of the gate electrode, i.e., the driving voltage remains unchanged. Further, in a period of the turn-off period, where the charges stored in the gate-collector capacitance are discharged, the potential of the gate electrode remains unchanged. This corresponds to the mirror period 80, and the driving voltage during this mirror period is referred to as a mirror voltage VM.

According to the present embodiment, in the same structure as in the first embodiment, the voltage Vb of the voltage source 41 of the turn-on circuit 40 is set smaller than the mirror voltage VM, and the voltage Vc of the voltage source 51 of the turn-off circuit 50 is set larger than the VM. That is, Vb<VM<Vc. Accordingly, in the turn-on period, the combined resistance of the driving circuit 20 increases when (at the time t2 in FIG. 8) the driving voltage reaches the Vb before reaching the VM, so that the combined resistance of the driving circuit 20 is larger when the driving voltage reaches the Vb than before the driving voltage reaches the Vb. Thus, the change rate of the driving voltage is kept small so that overshooting and ringing in the driving voltage at the moment when the mirror period comes can be reduced. In contrast, in the turn-off period, the combined resistance of the driving circuit 20 increases when (at the time t5 in FIG. 8) the driving voltage reaches the Vc before reaching the VM, so that the combined resistance of the driving circuit 20 is larger when the driving voltage reaches the Vc than before the driving voltage reaches the Vc. Thus, the change rate of the driving voltage is kept small so that undershooting and ringing in the driving voltage at the moment when the mirror period comes can be reduced. That is, noise in the driving voltage to be outputted to the output terminal 20b can be reduced.

Although the present embodiment is based on an example where Vb<VM<Vc, it is not limited to this example. In both the turn-on period and the turn-off period, the change rate of the driving voltage after the mirror period comes can be reduced by the circuit structure satisfying the following relationship: Vc<VM<Vb.

Fifth Embodiment

Figure 9:
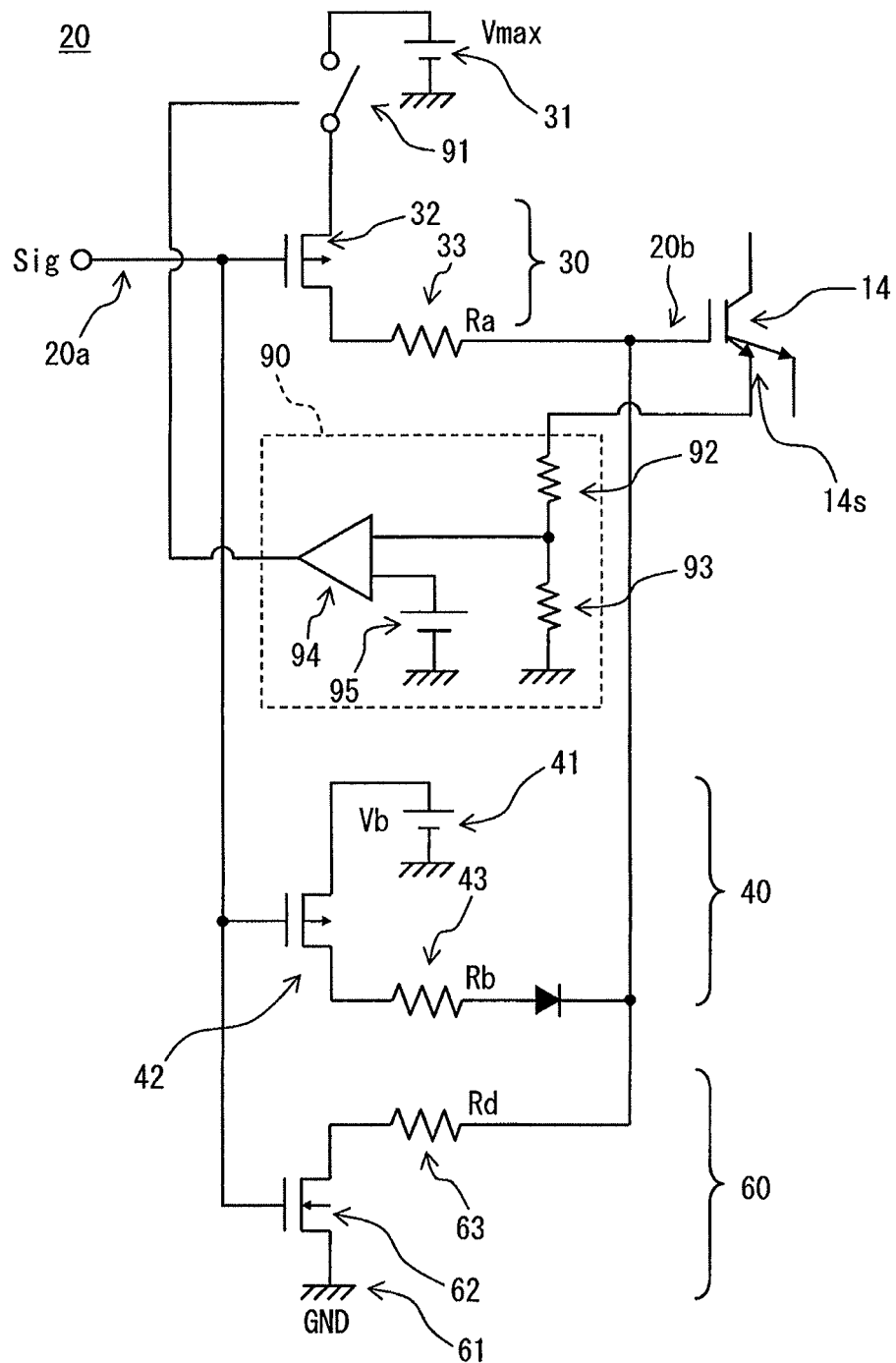
FIG. 9 is a diagram illustrating a concrete structure of a driving circuit and a protection circuit of a driving device according to a fifth embodiment.

According to the present embodiment, as shown in FIG. 9, a protection circuit 90 for protecting the switching element (e.g., the IGBT 14) to be connected to the output terminal 20b from overcurrent. According to the present embodiment, the driving circuit 20 includes the maximum voltage circuit 30, the turn-on circuit 40, and the reference voltage circuit 60 like in the second embodiment, and a control switch 91 for controlling the presence or absence of supply of the maximum voltage Vmax to the driving circuit 20 is added between the voltage source 31 and the switch 32 of the maximum voltage circuit 30. For example, this control switch 91 can be a MOS transistor and turned ON and OFF in accordance with an input signal to its gate. Further, a current detection terminal 14s of the IGBT 14 is connected through the protection circuit 90 to the gate of the control switch 91. The protection circuit 90 outputs the signal, for turning ON or OFF, to the gate of the control switch 91 in accordance with a current outputted from the current detection terminal 14s.

According to the present embodiment, for example, the protection circuit 90 can be configured as follows. As shown in FIG. 9, the protection circuit 90 includes a first inner resistor 92, a second inner resistor 93, an operational amplifier 94, and a reference power source 95. The first inner resistor 92 and the second inner resistor 93 are connected in series between the current detection terminal 14s of the IGBT 14 and the ground potential. A connection point between the first inner resistor 92 and the second inner resister 93 is connected to one of input terminals of the operational amplifier 94. The other of the input terminals of the operational amplifier 94 is connected to the reference power source 95. The operational amplifier 94 compares a voltage drop across the first inner resistor 92 produced by a current flowing from the current detection terminal 14s to the protection circuit 90 with a potential of the reference power source 95. According to the present embodiment, when the voltage drop exceeds the potential of the reference power source 95, the signal for turning OFF the control switch 91 is outputted.

This structure can interrupt a supply of a voltage from the voltage source 31, which outputs the largest voltage in the driving circuit 20, to the IGBT 14 when an abnormal current flows through the IGBT 14. This protection circuit 90 can be used effectively, in particular, for a turn-on operation which changes the driving voltage from low to high.

Although the present embodiment is based on an example where the protection circuit 90 is added to the circuit structure shown in the second embodiment, it is not limited to this. That is, the protection circuit 90 can be added to the circuit structure shown in any of the preceding embodiments.

Sixth Embodiment

Figure 10:
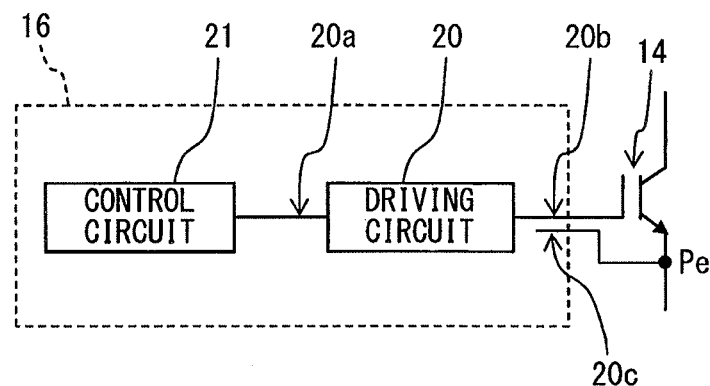
FIG. 10 is a diagram illustrating a circuit structure of a driving device according to a sixth embodiment.
Figure 11:
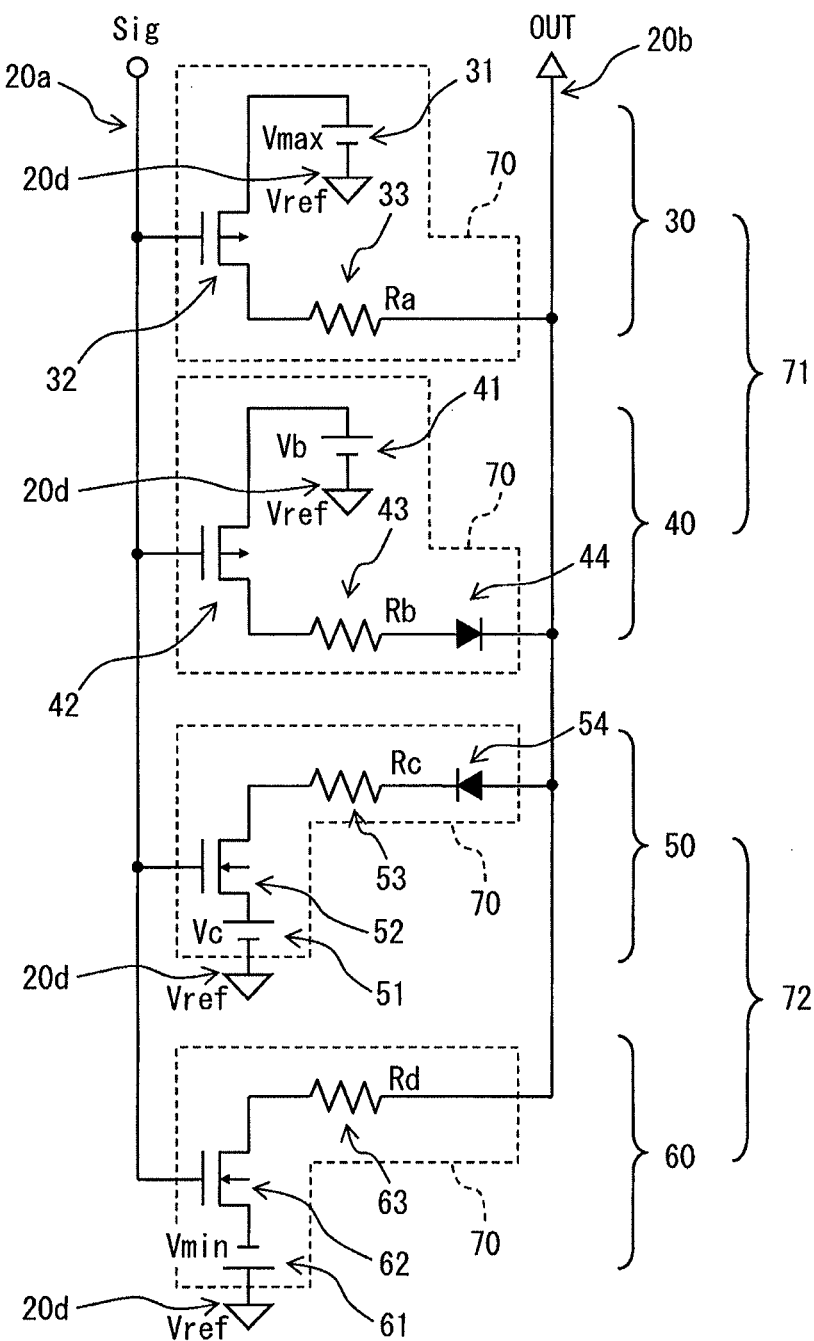
FIG. 11 is a diagram illustrating a concrete structure of a driving circuit of the driving device according to the sixth embodiment.
Figure 12:
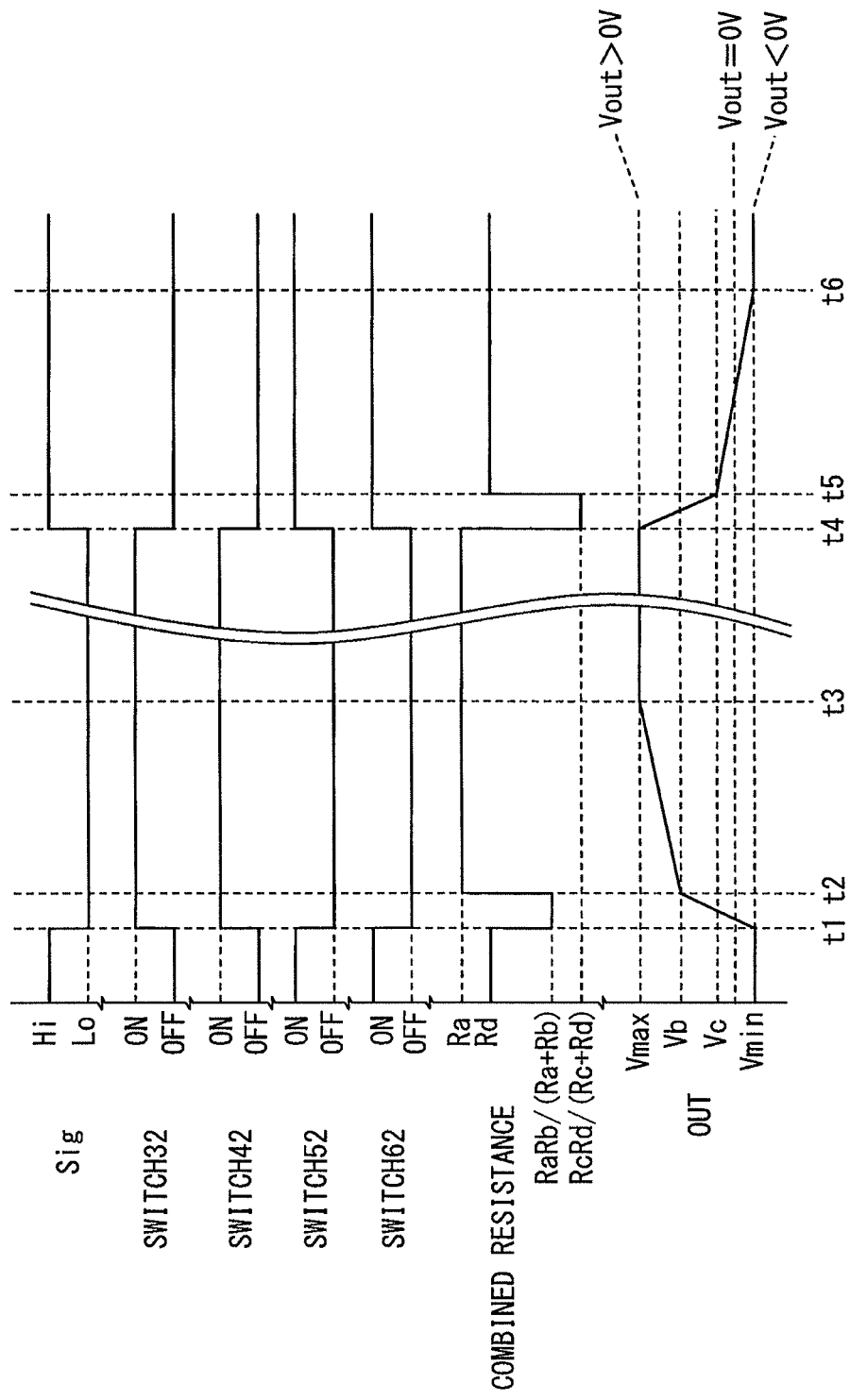
FIG. 12 is a timing diagram illustrating a control signal from a control circuit, ON and OFF states of each switch of the driving circuit, a combined resistance of the driving circuit, and a voltage of an output terminal according to the sixth embodiment.

A driving device according to a sixth embodiment is described with reference to FIGS. 10, 11, and 12. FIGS. 10, 11, and 12 correspond to FIGS. 2, 3, and 4, respectively. The lowest voltage source 61 in the driving circuit 20 is the ground potential (0V) in the first embodiment, but is a negative voltage source (<0V) in the present embodiment. The following description focuses on differences from the first embodiment.

According to the present embodiment, as shown in FIG. 10, a reference potential terminal Vref 20d of the driving circuit 20 is connected to an emitter terminal Pe of the IGBT 14 through a reference potential connection wire 20c.

Further, as shown in FIG. 11, in the driving circuit 20, the voltage source 61 has a reference voltage Vmin lower than those of the other voltage sources 31, 41, and 51. According to the present embodiment, the voltage source 61 is a negative voltage source (Vmin<0V). The voltages Vmax, Vb, Vc, and Vmin of the voltage sources 31, 41, 51, and 61 have the following magnitude relationship: Vmax>(Vb, Vc)>Vmin.

Next, operations and effects of the driving circuit 20 according to the present embodiment are described with reverence to FIG. 12. As described above, the magnitude relationships between Vb and Vc, between Rb and Rc, and between Ra and Rd are not limited. However, according to the present embodiment, the magnitude relationships are set as follows: Vb>Vc, Rb>Rc, and Ra>Rd.

FIG. 12 shows an example of a timing diagram when the driving voltage is applied to the output terminal 20b and by extension to the IGBT 14. In this example, there is a turn-on period (t1 to t3) where a driving voltage (Vout) outputted to the output terminal 20b changes from the reference voltage Vmin to the maximum voltage Vmax and a turn-off period (t4 to t6) where the driving voltage outputted to the output terminal 20b changes from the Vmax to the Vmin. The turn-on starts at a time t1 and ends at a time t3 by way of a time t2. Then, the maximum voltage Vmax is outputted to the output terminal 20b during a period from the time t3 to a time t4. Then, the turn-off starts at the time t4 and ends at a time t6 by way of a time t5. The time-series behavior of the driving is described in detail below.

Before the turn-on starts (before t1), i.e., in an initial power-on state or in an initial state from when the time t6 passes to when the time t1 comes, the Hi signal as the control signal Sig is inputted to the input terminal 20a. Accordingly, the switches 32, 42 are in OFF state so that the voltage sources 31, 41 can be electrically isolated from the output terminal 20b. In contrast, the switches 52, 62 are in ON state so that the voltage sources 51, 61 can be electrically connected to the output terminal 20b. Thus, the circuit group 71 is in OFF state, and the circuit group 72 is in ON state. However, in the initial state, since the driving voltage at the output terminal 20b is at the Vmin, the diode 54 of the turn-off circuit 50 prevents a current from flowing from the voltage source 51 whose voltage is higher than the Vmin to the output terminal 20b. Therefore, the driving voltage outputted to the output terminal 20b is the Vmin, and a combined resistance of the driving circuit 20 is equal to the Rd.

The Sig changes from the Hi signal to the Lo signal at the time t1. Accordingly, the switches 32, 42 are turned ON so that the voltage sources 31, 41 can be electrically connected to the output terminal 20b. In contrast, the switches 52, 62 are turned OFF so that the voltage sources 51, 61 can be electrically isolated from the output terminal 20b. Thus, the circuit group 71 is tuned ON, and the circuit group 72 is turned OFF. Since the Vmax and the Vd are higher in voltage than the Vmin, the driving voltage outputted to the output terminal 20b starts to increase from the GND.

After the time t1, the driving voltage increases at a predetermined rate of change. This change rate depends on an internal resistance of the driving circuit 20, and a change in the driving voltage with respect to an elapsed time decreases with an increase in the resistance. During a period from the time t1 to the time t2 when the driving voltage reaches the Vb, a current flows from each of the voltage sources 31, 41 of the maximum voltage circuit 30 and the turn-on circuit 40 toward the output terminal 20b. That is, the combined resistance of the driving circuit 20 is given as follows: Ra·Rb/(Ra+Rb). Therefore, during the period from the time t1 to the time t2, the driving voltage changes from the Vmin to the Vb at the change rate depending on the combined resistance.

At the time t2, the driving voltage reaches the Vb. Accordingly, in the turn-on circuit 40, no current flows between the power source 41 and the output terminal 20b.

After the time t2, the driving voltage increases from the Vb to the Vmax. It is noted that the voltage of the output terminal 20b is higher than the Vb during a period from the time t2 to the time t3 when the driving voltage reaches the Vmax. However, the diode 44 of the turn-on circuit 40 prevents the backflow current from the output terminal 20b to the voltage source 41. That is, in the turn-on circuit 40, no current flows between the voltage source 41 and the output terminal 20b, and the combined resistance of the driving circuit 20 becomes equal to the Ra. According to the present embodiment, since Ra>Rb, the combined resistance Re in the period from the time t2 to the time t3 is greater than the combined resistance Ra·Rb/(Ra+Rb) in the period from the time t1 to the time t2. That is, Ra>Ra·Rb/(Ra+Rb). Accordingly, the change rate of the driving voltage is smaller in the period from the time t2 to the time t3 than in the period from the time t1 to the time t2. In other words, the combined resistance of the driving circuit 20 changes automatically at the time t2 so that the change rate of the driving voltage can change automatically. The time t2 depends on the resistances Ra, Rb of the resistors 33, 43 and the voltages Vmax, Vb of the voltage sources 31, 41. A designer can set arbitrary values for these resistances and voltages. According to the present embodiment, there is no need to use a control signal to change the driving voltage. That is, the change rate of the driving voltage can be changed by a simpler control signal after a predetermined time (the time t2 in the present embodiment).

The voltage Vmax is applied to the gate electrode of the IGBT 14 during the period from the time t3 when the turn-on ends, to the time t4 when the turn-off starts. For example, when the Vmax is set to about 15V, the IGBT can be turned ON without an increase in a saturation voltage (ON-resistance).

The Sig changes from the Lo signal to the Hi signal at the time t4. Accordingly, the switches 32, 42 are turned OFF so that the voltage sources 31, 41 can be electrically isolated from the output terminal 20b. In contrast, the switches 52, 62 are turned ON so that the voltage sources 51, 61 can be electrically connected to the output terminal 20b. Thus, the circuit group 71 is tuned OFF, and the circuit group 72 is turned ON. Since the Vmin and the Vc are lower in voltage than the Vmax, the driving voltage outputted to the output terminal 20b starts to decrease from the Vmax.

During the period from the time t4 to the time t5 when the driving voltage reaches the Vc, a current flows from the output terminal 20b toward each of the voltage sources 51, 61 of the turn-off circuit 50 and the reference voltage circuit 60. That is, the combined resistance of the driving circuit 20 is given as follows: Rc·Rd/(Rc+Rd). Therefore, during the period form the time t4 to the time t5, the driving voltage changes from the Vmax to the Vc at the change rate depending on this combined resistance.

At the time t5, the driving voltage reaches the Vc. Accordingly, in the turn-off circuit 50, no current flows between the voltage source 51 and the output terminal 20b.

After the time t5, the driving voltage decreases from the Vc to the Vmin. It is noted that the voltage of the output terminal 20b is lower than the Vc during the period from the time t5 to the time t6 when the driving voltage reaches the Vmin. However, the diode 54 of the turn-off circuit 50 prevents the backflow current from the voltage source 51 to the output terminal 20b. That is, in the turn-off circuit 50, no current flows between the voltage source 51 and the output terminal 20b, and the combined resistance of the driving circuit 20 becomes equal to the Rd. According to the present embodiment, since Rd>Re, the combined resistance Rd in the period from the time t5 to the time t6 is greater than the combined resistance Rc·Rd/(Rc+Rd) in the period from the time t4 to the time t5. That is, Rd>Rc·Rd/(Rc+Rd). Accordingly, the change rate of the driving voltage is smaller in the period from the time t5 to the time t6 than in the period from the time t4 to the time t5. In other words, the combined resistance of the driving circuit 20 changes automatically at the time t5 so that the change rate of the driving voltage can change automatically. The time t5 depends on the resistances Rc, Rd of the resistors 53, 63 and the voltages Vc, Vmin of the voltage sources 51, 61. A designer can set arbitrary values for these resistances and voltages. According to the present embodiment, there is no need to use a control signal to change the driving voltage. That is, the change rate of the driving voltage can be changed by a simpler control signal after a predetermined time (the time t5 in the present embodiment).

According to the present embodiment, the Vb and the Vc are set not less than a threshold of the IGBT 14. For example, the Vb and the Vc can be in a range from about 5V to 10V. A special effect of the present embodiment is that since the Vmin is a negative voltage (Vmin<0V), a turn-off can be speeded up, and a self-turn-on of the switching element at the time of the fast switching can be reduced.

The embodiment in which the lowest reference power source Vmin is a negative voltage source (Vmin<0V) is not limited to the above structure, and the number of negative voltage sources and a value of the negative voltage can be changed arbitrarily.

Further, it can be applied to the embodiments 2 to 5.

Other Embodiments

While the present disclosure has been described with reference to embodiments thereof, it is to be understood that the disclosure is not limited to the embodiments. The present disclosure is intended to cover various modifications and equivalent arrangements within the spirit and scope of the present disclosure.

In the embodiments described above, the switches 32, 42 of the maximum voltage circuit 30 and the turn-on circuit 40 are PMOS transistors, and the switches 52, 62 of the turn-off circuit 50 and the reference voltage circuit 60 are NMOS transistors. However, kinds (polarities) of these switches should be selected appropriately according to kinds of the control signal Sig inputted by the control circuit to the input terminal 20a. In the embodiments described above, the turn-on operation is performed when the Sig changes from Hi to Lo. Alternatively, the turn-on operation can be performed when the Sig changes from Lo to Hi. In this case, the switches 32, 42 should be NMOS transistors, and the switches 52, 62 should be PMOS transistors.

In the embodiments described above, the switches 32, 42, 52, and 62, and the control switch 91 are MOS transistors. Alternatively, these switches are not limited to the embodiments, as long as they have three or more terminals and are capable of being turned ON and OFF in accordance with the control signal from the control circuit 21 and the signal from the protection circuit 90 to pass and interrupt a current flow. However, when these switches are MOS transistors or bipolar transistors, they can be manufactured in the same process as a semiconductor element such as the IGBT In the embodiments described above, each of the turn-on circuit 40 and the turn-off circuit 50 has one unit circuit 70. Alternatively, each of the turn-on circuit 40 and the turn-off circuit 50 can have multiple unit circuits 70 whose voltage sources have different voltages and whose resistors have different resistances. In this configuration, the change rate of the driving voltage can be changed two or more times during the turn-on period and the turn-off period. That is, the timing at which the change rate of the driving voltage is changed can be set in more details. It is noted that as described in the first embodiment, when each of the turn-on circuit 40 and the turn-off circuit 50 has one unit circuit 70, the change rate of the driving voltage can be changed without a feedback mechanism while the circuit structure of the driving device is simplified.

In the first embodiment, the driving device has the protection circuit 90. A structure of the protection circuit 90 is not limited to that described in the fifth embodiment as long as the protection circuit 90 can detect a current flowing through the switching element (IGBT 14) and interrupt power supply from the voltage source 31 to the switching element when the current exceeds a predetermined threshold current.

What is claimed is:

1. A driving apparatus for applying a driving voltage to a switching element, the driving apparatus comprising:
a driving circuit having an input terminal and an output terminal, the driving circuit applying the driving voltage to the switching element through the output terminal, and
a control circuit that outputs two types of control signals including a Hi signal and a Lo signal to the input terminal of the driving circuit to control the driving circuit, wherein
the driving circuit includes a plurality of unit circuits, each of the plurality of unit circuits includes one voltage source, one switch controlled to be turned ON and OFF by the control signals, and one resistor connected in series to the switch between the voltage source and the output terminal, some of the plurality of unit circuits are turned ON by a control signal that is common to the plurality of unit circuits and form at least one circuit group, in the circuit group, the voltage source of each unit circuit outputs a different voltage, and the resistor of each unit circuit has a different resistance, in the driving circuit, the switch of each of the plurality of unit circuits is electrically connected to the input terminal that is common to the plurality of unit circuits, and one end of the resistor of each unit circuit is electrically connected to the same output terminal, the input terminal receives the two types of control signals including the Hi signal and the Lo signal from the control circuit, and the control circuit outputs the two types of control signals directly to the switch of each unit circuit.

2. The driving apparatus according to claim 1, wherein the driving circuit includes a maximum voltage circuit, a reference voltage circuit, and at least one of a turn-on circuit and a turn-off circuit, the maximum voltage circuit has one of the plurality of unit circuits and outputs a maximum voltage as the driving voltage to the switching element, the reference voltage circuit has one of the plurality of unit circuits and outputs a reference voltage as the driving voltage to the switching element, the reference voltage being the lowest voltage in the voltage sources, each of the turn-on circuit and the turn-off circuit has at least one of the plurality of unit circuits, the voltage of the voltage source of the at least one of the plurality of unit circuits is between the maximum voltage and the reference voltage, the circuit group includes a first circuit group and a second circuit group, the maximum voltage circuit and the turn-on circuit form the first circuit group, the reference voltage circuit and the turn-off circuit form the second circuit group, in the turn-on circuit, the resistance of the resistor is smaller than the resistance of the resistor of the maximum voltage circuit, and a diode is located between the resistor and the output terminal to prevent a backflow current from the output terminal to the resistor, in the turn-off circuit, the resistance of the resistor is smaller than the resistance of the resistor of the reference voltage circuit, and a diode is located between the resistor and the output terminal to prevent a backflow current from the resistor to the output terminal.

3. The driving device according to claim 1, wherein each of the turn-on circuit and the turn-off circuit has one of the plurality of unit circuits.

4. The driving device according to claim 2, wherein the driving circuit includes the turn-on circuit and a protection circuit, and the protection circuit electrically isolates the voltage source which supplies the maximum voltage from the switching element when a current flowing through the switching element exceeds a predetermined current value.

5. The driving device according to claim 1, wherein the switch is a MOS transistor.

6. The driving device according to claim 1, wherein the switching element is a power semiconductor element.

7. The driving apparatus according to claim 1, wherein the switch of each of the plurality of unit circuits receives the control signal that is common to switches of the plurality of unit circuits.

8. The driving apparatus according to claim 1, wherein the input terminal of the driving circuit comprises a single input terminal that connects the driving circuit to the control circuit.

9. The driving apparatus according to claim 1, wherein the control circuit is configured to change the driving voltage and a change rate of the driving voltage by outputting only the two types of control signals to the input terminal of the driving circuit.

10. The driving apparatus according to claim 1, wherein the control circuit is configured to output only the two types of control signals.

11. The driving apparatus according to claim 1, wherein the plurality of unit circuits are connected in parallel.

12. A driving device, comprising:
a control circuit configured to output a single control signal;
a driving circuit configured to receive the single control signal and including
    an input terminal connecting the driving circuit to the control circuit via a common line,
    a maximum voltage circuit including a first voltage source, a first switch, and a first resistor connected in series, the first switch being connected to the input terminal,
    a turn-on circuit connected in parallel to the first switch of the maximum voltage circuit and including a second voltage source, a second switch, a second resistor, and a first diode connected in series,
    a turn-off circuit connected in parallel to the second switch of the turn-on circuit and including a third voltage source, a third switch, a third resistor, and a second diode connected in series,
    a reference voltage circuit connected in parallel to the third switch of the turn-off circuit and including a fourth voltage source, a fourth switch, and a fourth resistor connected in series, and
    an output terminal connected to the first resistor, the first diode, the second diode, and the fourth resistor, wherein
the control circuit is configured to directly output the control signal to the first switch, the second switch, the third switch, and the fourth switch.

13. The driving device according to claim 12, wherein the control circuit is configured to output only the Hi signal and the Lo signal.

14. The driving device according to claim 12, wherein the output terminal is connected to the first resistor, the first diode, the second diode, and the fourth resistor via a single line.

* * * * *